United States Patent
Tanijiri et al.

(10) Patent No.: US 10,381,587 B2
(45) Date of Patent: Aug. 13, 2019

(54) LIGHT EMITTING APPARATUS CONTAINING SEALING MEMBER TO COVER PLANAR LIGHT EMITTER

(71) Applicant: Konica Minolta, Inc., Tokyo (JP)

(72) Inventors: Yasushi Tanijiri, Osakasayama (JP); Masatoshi Yoneyama, Izumi (JP); Junya Wakahara, Yokohama (JP); Mitsuyoshi Naito, Toyonaka (JP); Naoki Kimura, Takatsuki (JP); Kenji Hiraiwa, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 16/080,590

(22) PCT Filed: Nov. 14, 2016

(86) PCT No.: PCT/JP2016/083662
§ 371 (c)(1),
(2) Date: Aug. 28, 2018

(87) PCT Pub. No.: WO2017/149846
PCT Pub. Date: Sep. 8, 2017

(65) Prior Publication Data
US 2019/0067613 A1 Feb. 28, 2019

(30) Foreign Application Priority Data
Mar. 2, 2016 (JP) .................................. 2016-039954

(51) Int. Cl.
*H01L 51/50* (2006.01)
*H05B 33/04* (2006.01)
(Continued)

(52) U.S. Cl.
CPC .......... *H01L 51/5012* (2013.01); *H01L 51/50* (2013.01); *H01L 51/5246* (2013.01);
(Continued)

(58) Field of Classification Search
CPC ............. H01L 51/5012; H01L 51/5253; H01L 51/5246; H05B 33/06; H05B 33/04
See application file for complete search history.

(56) References Cited

FOREIGN PATENT DOCUMENTS

| JP | 2008-103254 A | 5/2008 |
| JP | 2010-244698 A | 10/2010 |

(Continued)

OTHER PUBLICATIONS

International Search Report dated Feb. 7, 2017 from corresponding International Application No. PCT/JP2016/083662 and English translation.
(Continued)

*Primary Examiner* — Joseph L Williams
(74) *Attorney, Agent, or Firm* — Lucas & Mercanti, LLP (57) ABSTRACT

A light emitting apparatus includes: a sealing member (20) forming a sealing region sealing a planar light emitting unit; and a wiring member (51) including a conductive unit (61) electrically connected to the planar light emitting unit and extending from the sealing region to an outside. The sealing member (20) has a drawing port opened at a periphery of the sealing member for drawing the wiring member (51) to the outside. The wiring member (51) includes: an internal wiring portion (71) in which the conductive unit (61) is disposed in the sealing region; an external wiring portion (72) in which the conductive unit (61) is disposed in the outside; and a boundary wiring portion (73) in which the conductive unit (61) is disposed in the drawing port and which has a smaller thickness than the internal wiring portion (71) and/or the external wiring portion (72). Such a
(Continued)

configuration provides a light emitting apparatus having a sealing structure of the planar light emitting unit for suppressing deterioration of sealing performance due to disposition of the wiring member.

20 Claims, 6 Drawing Sheets (51) Int. Cl.
  *H01L 51/52* (2006.01)
  *H05B 33/06* (2006.01)
(52) U.S. Cl.
  CPC ......... *H01L 51/5253* (2013.01); *H05B 33/04* (2013.01); *H05B 33/06* (2013.01)

(56) References Cited

FOREIGN PATENT DOCUMENTS

| | | |
|---|---|---|
| JP | 2011-027815 A | 2/2011 |
| JP | 2013-157328 A | 8/2013 |
| WO | 2011/136262 A1 | 11/2011 |

OTHER PUBLICATIONS

Written Opinion of the International Searching Authority dated Feb. 7, 2017 from corresponding International Application No. PCT/JP2016/083662 and English translation.

LIGHT EMITTING APPARATUS CONTAINING SEALING MEMBER TO COVER PLANAR LIGHT EMITTER

CROSS REFERENCE TO RELATED APPLICATION

This Application is a 371 of PCT/JP2016/083662 filed on Nov. 14, 2016 which, in turn, claimed the priority of Japanese Patent Application No. 2016-039954 filed on Mar. 2, 2016, both applications are incorporated herein by reference.

TECHNICAL FIELD

The present invention relates generally to a light emitting apparatus, and more specifically to a light emitting apparatus having a sealing structure of a planar light emitting unit.

BACKGROUND ART

Regarding a conventional light emitting apparatus, for example, JP 2010-244698 A discloses an organic EL apparatus aiming at having a high mechanical strength and excellent sealing properties (Patent Literature 1). The organic EL apparatus disclosed in Patent Literature 1 includes an organic EL panel, a wiring substrate, and a pair of film sheets sandwiching the organic EL panel and the wiring substrate. The pair of film sheets is bonded at a periphery of the organic EL element, and the organic EL panel is thereby sealed inside the pair of film sheets. A gap between the film sheet and the organic EL panel and a gap between the film sheet formed on an end face of the wiring substrate and the wiring substrate are sealed with a first sealing resin layer.

In addition, JP 2008-103254 A discloses an organic EL device aimed at simplifying a structure for airtight sealing and forming the organic EL device by applying substantially uniform pressure as a whole (Patent Literature 2). The organic EL device disclosed in Patent Literature 2 includes an organic EL element, a first film-like substrate and a second film-like substrate disposed so as to sandwich the organic EL element and having extension portions bonded to each other around the organic EL element, and a gas barrier film disposed so as to cover at least end faces of the bonded extension portions of the first film-like substrate and the second film-like substrate.

In addition, JP 2011-27815 A discloses an electro-optical apparatus aiming at ensuring sufficient durability performance (Patent Literature 3). The electro-optical apparatus disclosed in Patent Literature 3 includes a display panel including an organic EL layer and two resin films laminating the display panel from front and back surfaces thereof.

CITATION LIST

Patent Literature

Patent Literature 1: JP 2010-244698 A
Patent Literature 2: JP 2008-103254 A
Patent Literature 3: JP 2011-27815 A

SUMMARY OF INVENTION

Technical Problem

As disclosed in the above Patent Literatures 1 to 3, a planar light emitting apparatus (lighting apparatus) using a light emitting device such as an organic EL panel has been proposed, and not only indoor lighting applications but also use as an outdoor signboard, internal lighting for signs, and a material for illumination is considered.

In such a light emitting apparatus, in order to protect the light emitting device from wind and rain, dust, air, and the like, it is necessary to dispose a sealing structure with a sealing member such as a film. In particular, the organic EL panel has low resistance to moisture, oxygen, and the like. Therefore, in a light emitting apparatus using an organic EL panel as a light emitting device, necessity of disposing such a sealing structure is large.

Meanwhile, in the light emitting apparatus having such a sealing structure as described above, electrical connection from an outside to the light emitting device is a problem. When electric wiring is taken to an outside from a light emitting device sealed with a sealing member such as a film, even generation of a small gap may cause, for example, invasion of oxygen, moisture, or the like from the gap, penetration of oxygen, moisture, or the like through a bonding surface between the sealing members, or penetration of oxygen, moisture, or the like from a surface direction of a substrate of the light emitting device. For example, in a case where electric wiring is taken out using a flexible wiring board, due to the thickness of the flexible wiring board, a gap is generated in a sealing member at an end of the flexible wiring board, and invasion of oxygen, moisture, or the like is allowed. In this case, the light emitting device cannot be adequately protected from oxygen, moisture, or the like.

Therefore, an object of the present invention is to solve the above problems and to provide a light emitting apparatus having a sealing structure of a planar light emitting unit for suppressing deterioration of sealing performance due to disposition of the wiring member.

Solution to Problem

A light emitting apparatus according to one aspect of the present invention includes: a planar light emitting unit having a light emitting surface and a back surface disposed on a back side of the light emitting surface; a sealing member disposed so as to cover the planar light emitting unit from both sides of the light emitting surface and the back surface and forming a sealing region sealing the planar light emitting unit; and a wiring member including a conductive unit electrically connected to the planar light emitting unit and extending from the sealing region to an outside. The sealing member has a drawing port opened at a periphery of the sealing member when the light emitting surface and the back surface are viewed in plan view for drawing the wiring member to the outside. The wiring member includes an internal wiring portion in which the conductive unit is disposed in the sealing region; an external wiring portion in which the conductive unit is disposed in the outside; and a boundary wiring portion in which the conductive unit is disposed in the drawing port and which has a smaller thickness than the internal wiring portion and/or the external wiring portion in a thickness direction of the planar light emitting unit.

A light emitting apparatus according to another aspect of the present invention includes: a planar light emitting unit having a light emitting surface and a back surface disposed on a back side of the light emitting surface; a sealing member disposed so as to cover the planar light emitting unit from both sides of the light emitting surface and the back surface and forming a sealing region sealing the planar light emitting unit; and a flexible wiring board including a base material, a conductive unit disposed on a surface of the base material and electrically connected to the planar light emitting unit, and a cover portion disposed so as to cover the conductive unit, and extending from the sealing region to an outside. The sealing member has a drawing port opened at a periphery of the sealing member when the light emitting surface and the back surface are viewed in plan view for drawing the flexible wiring board to the outside. In either one of the cover portion and the base material, in a cross section including the drawing port, a cutout portion is formed such that the width of either one of the cover portion and the base material in a direction orthogonal to a thickness direction of the planar light emitting unit is smaller than the width of the other of the cover portion and the base material in the direction orthogonal to the thickness direction of the planar light emitting unit.

Note that the term "outside" in the present invention means a region outside the sealing region, released to a space around the sealing member.

Advantageous Effects of Invention

According to the present invention, it is possible to provide a light emitting apparatus having a sealing structure of a planar light emitting unit for suppressing deterioration of sealing performance due to disposition of a wiring member.

DESCRIPTION OF EMBODIMENTS

Embodiments of the present invention will be described with reference to the drawings. Note that the same or equivalent members are denoted by the same reference numerals in the drawings referred to below.

First Embodiment

Figure 1:
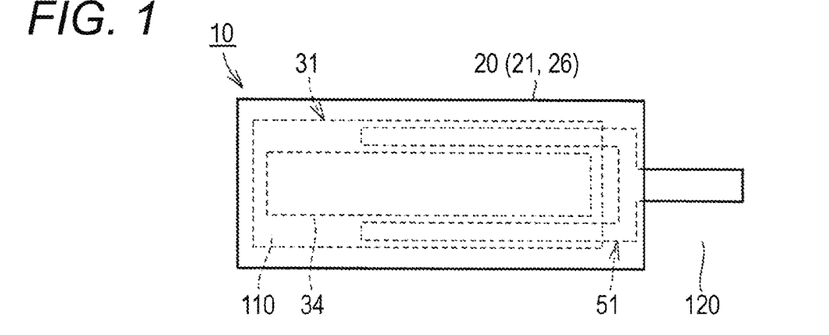
FIG. 1 is a plan view illustrating a light emitting apparatus according to a first embodiment of the present invention.
Figure 2:
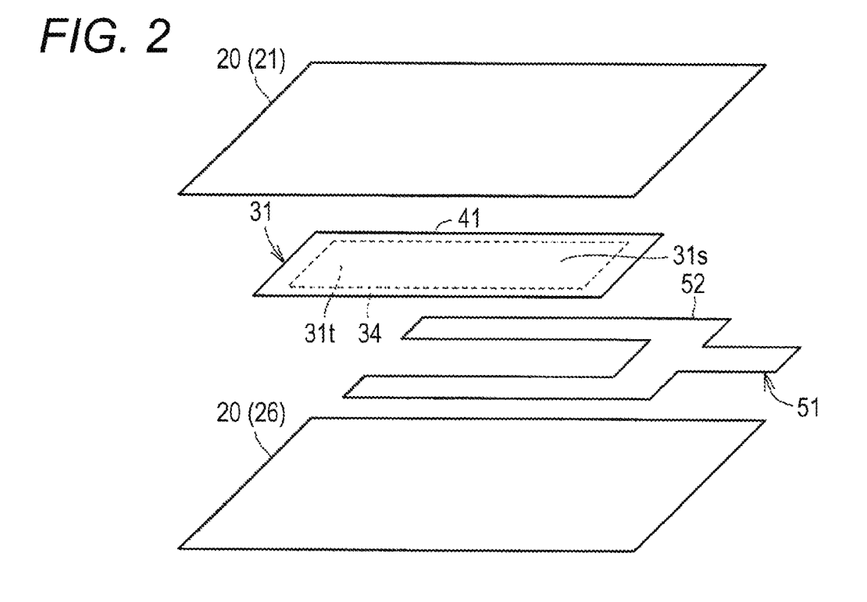
FIG. 2 is an exploded and assembled view illustrating the light emitting apparatus in FIG. 1.

FIG. 1 is a plan view illustrating a light emitting apparatus according to a first embodiment of the present invention. FIG. 2 is an exploded and assembled view illustrating the light emitting apparatus in FIG. 1.

With reference to FIGS. 1 and 2, a light emitting apparatus 10 according to the present embodiment has a thin plate shape and is used for various applications such as lighting, decoration, and backlight.

The light emitting apparatus 10 includes a planar light emitting unit 31. The planar light emitting unit 31 is disposed as a light emitting means (light emitting device) extending in a planar shape. In the present embodiment, the planar light emitting unit 31 is formed of an organic EL panel. The planar light emitting unit 31 has flexibility and is bendable as a whole. The light emitting apparatus 10 may include a plurality of the planar light emitting units 31.

Figure 3:
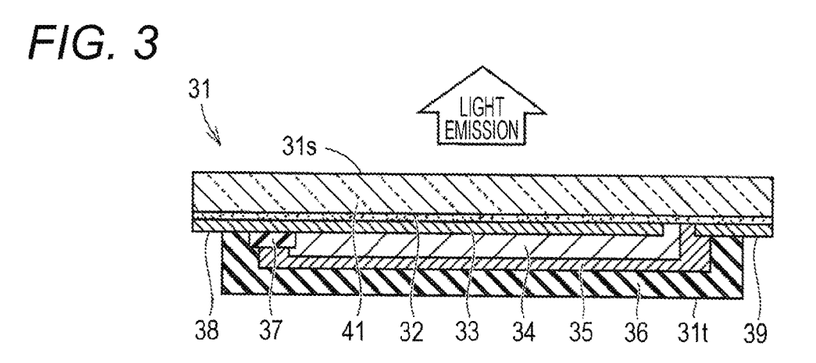
FIG. 3 is a cross-sectional view illustrating a planar light emitting unit in FIG. 1.

FIG. 3 is a cross-sectional view illustrating the planar light emitting unit in FIG. 1. With reference to FIG. 3, the planar light emitting unit 31 has a light emitting surface 31s and a back surface 31t. The planar light emitting unit 31 emits light from the light emitting surface 31s. The back surface 31t is disposed on a back side of the light emitting surface 31s.

The planar light emitting unit 31 has a rectangular shape in plan view in which the light emitting surface 31s and the back surface 31t are viewed from the front. The planar light emitting unit 31 has a thickness of 50 μm to 200 μm, for example.

The planar light emitting unit 31 includes a transparent substrate 41 as a substrate, a barrier layer 32, an anode 33, an organic layer 34 as a light emitting element, a cathode 35, a sealing layer 36, and an insulating layer 37.

The transparent substrate 41 is disposed on the light emitting surface 31s side of the planar light emitting unit 31. The barrier layer 32 is disposed so as to cover a surface of the transparent substrate 41 on the opposite side to the light emitting surface 31s. The anode 33, the organic layer 34, and the cathode 35 are sequentially laminated on the barrier layer 32. The sealing layer 36 is disposed so as to cover the laminate formed of the anode 33, the organic layer 34, and the cathode 35.

The transparent substrate 41 has transparency. Examples of a member constituting the transparent substrate 41 include a light transmissive film substrate such as polyethylene terephthalate (PET) or polycarbonate (PC).

Examples of the light transmissive film substrate further include polyimide, polyethylene naphthalate (PEN), polystyrene (PS), polyethersulfone (PES), and polypropylene (PP).

The barrier layer 32 has transparency. The barrier layer 32 is formed of, for example, a silicon compound such as a silicon oxide or a silicon nitride, a metal compound such as a metal oxide or a metal nitride, or a mixture thereof. The barrier layer 32 is disposed in order to protect the organic layer 34 from moisture, oxygen, or the like in the atmosphere or the substrate.

The anode 33 is a conductive film having transparency. In order to form the anode 33, a film of indium tin oxide (ITO) or the like is formed on the transparent substrate 41 by a sputtering method or the like. Examples of the material used for the anode 33 further include polyethylene dioxythiophene (PEDOT).

The organic layer 34 can generate light (visible light) by supply of power. The organic layer 34 may be formed of a single light emitting layer or may be formed by sequentially laminating a hole transporting layer, a light emitting layer, a hole blocking layer, an electron transporting layer, and the like.

The cathode 35 is formed of, for example, aluminum (Al). The cathode 35 is formed so as to cover the organic layer 34 by a vacuum vapor deposition method or the like. In order to pattern the cathode 35 into a predetermined shape, it is favorable to use a mask for vacuum deposition. Examples of the material of the cathode 35 further include lithium fluoride (LiF), a laminate of Al and Ca, a laminate of Al and LiF, and a laminate of Al and Ba.

The insulating layer 37 is disposed between the cathode 35 and the anode 33 in order to prevent short circuit between the cathode 35 and the anode 33. After a film of $SiO_2$ or the like is formed, for example, by a sputtering method, the insulating layer 37 is formed in a desired pattern so as to cover a portion insulating the cathode 35 and the anode 33 from each other by a photolithography method or the like.

The sealing layer 36 is disposed on the back surface 31t side of the planar light emitting unit 31. The sealing layer 36 is formed of an insulating resin. The sealing layer 36 is disposed in order to protect the organic layer 34 from moisture, oxygen, and the like in the atmosphere. The sealing layer 36 seals the anode 33, the organic layer 34, and the cathode 35 on the transparent substrate 41. Note that a part of the anode 33 is exposed from the sealing layer 36 for electrical connection.

For the sealing layer 36, a layer having gas barrier properties obtained by laminating an inorganic thin film such as $SiO_2$, $Al_2O_3$, or SiNx, a flexible acrylic resin thin film, or the like in a plurality of layers on a film of PET, PEN, PS, PES, or polyimide may be used.

A portion of the anode 33 (the portion on the left side in FIG. 3) exposed from the sealing layer 36 constitutes a power feeding portion (for anode) 38. The power feeding portion 38 and the anode 33 are formed of the same material as each other. A portion of the cathode 35 (the portion on the right side in FIG. 3) exposed from the sealing layer 36 constitutes a power feeding portion (for cathode) 39. The feeding portion 39 and the cathode 35 are formed of the same material as each other.

In the planar light emitting unit 31 configured as described above, power is fed to the organic layer 34 through wiring member 51, the power feeding portions 38 and 39, the anode 33, and the cathode 35 described below. Light generated in the organic layer 34 by supply of power is emitted from the light emitting surface 31s to an outside through the anode 33, the barrier layer 32, and the transparent substrate 41.

Note that the planar light emitting unit 31 in which the back surface 31t is a non-light emitting surface has been described in the present embodiment. However, the planar light emitting unit in the present invention is not limited to such a configuration but may be a double-sided light emitting unit in which the back surface is also a light emitting surface. In addition, in the present embodiment, the case where the planar light emitting unit 31 has flexibility has been described. However, the planar light emitting unit 31 may have a rigid configuration that is not bendable.

With reference to FIGS. 1 to 3, the light emitting apparatus 10 further includes a sealing member 20. The sealing member 20 is disposed so as to cover the planar light emitting unit 31 from both sides of the light emitting surface 31s and the back surface 31t. The sealing member 20 forms a sealing region 110 sealing the planar light emitting unit 31.

In the present embodiment, as the sealing member 20, a sealing sheet 21 as a first sealing sheet and a sealing sheet 26 as a second sealing sheet are disposed.

The sealing sheets 21 and 26 are disposed on the light emitting surface 31s side of the planar light emitting unit 31 and on the back surface 31t side thereof, respectively. The planar light emitting unit 31 is disposed between the sealing sheet 21 and the wiring member 51 described below in a thickness direction of the planar light emitting unit 31. The wiring member 51 described below is disposed between the planar light emitting unit 31 and the sealing sheet 26 in the thickness direction of the planar light emitting unit 31.

The sealing sheets 21 and 26 each have a sheet shape and have substantially the same shape in plan view thereof. The sealing sheets 21 and 26 each have a substantially rectangular shape in plan view thereof. Peripheries of the sealing sheets 21 and 26 are bonded to each other over the entire peripheries, and the planar light emitting unit 31 is thereby sealed in the sealing region 110. The planar light emitting unit 31 is vacuum-laminated by the sealing sheets 21 and 26. That is, the sealing sheets 21 and 26 seal the planar light emitting unit 31 in a state where substantially no air is present in the sealing region 110.

As the sealing sheets 21 and 26, for example, a sheet-shaped resin member is used. The sealing sheets 21 and 26 have flexibility. The sealing sheets 21 and 26 each have approximately the same thickness as the planar light emitting unit 31.

Specific examples of materials of the sealing sheets 21 and 26 include polyethylene terephthalate, polypropylene, acrylic, polyimide, and polysulfone. As the sealing sheets 21 and 26, in addition to these materials, a product which has been subjected to various kinds of film formation in order to improve barrier properties may be used. The color of each of the sealing sheets 21 and 26 is not particularly limited. However, at least the sealing sheet 21 out of the sealing sheets 21 and 26 has high transparency in order to transmit light emitted from the light emitting surface 31s of the planar light emitting unit 31. Both the sealing sheets 21 and 26 may have transparency. One surface or both surfaces of each of the sealing sheets 21 and 26 may be coated with a barrier coating agent for enhancing sealing performance from a surface direction.

In order to bond the sealing sheets 21 and 26 to each other, an adhesive layer (not illustrated) is disposed on an inner surface of each of the sealing sheets 21 and 26. As an adhesive for forming the adhesive layer, various materials such as a thermoplastic resin, a thermosetting resin, and an ultraviolet curing resin are used. The adhesive layer has a thickness of 20 μm to 100 μm, for example.

The light emitting apparatus 10 further includes the wiring member 51. The wiring member 51 has a sheet shape and overlaps with the planar light emitting unit 31 in a thickness direction of the planar light emitting unit 31. The wiring member 51 has almost the same thickness as the planar light emitting unit 31. The wiring member 51 is bendable as a whole. The wiring member 51 is disposed so as to extend from the sealing region 110 toward an external region 120 outside the sealing region 110. The external region 120 is released to a space around the sealing member 20.

More specifically, in the sealing region 110, a part of the wiring member 51 overlaps with the planar light emitting unit 31 in the thickness direction of the planar light emitting unit 31. The wiring member 51 is disposed so as to face the back surface 31t side of the planar light emitting unit 31. In the sealing region 110, the wiring member 51 is electrically connected to the planar light emitting unit 31. In the external region 120, external wiring to which external power is supplied is connected to the wiring member 51. In the external region 120, an electronic component such as a capacitor, a resistor, or an integrated circuit (IC) may be connected to the wiring member 51.

Figure 4:
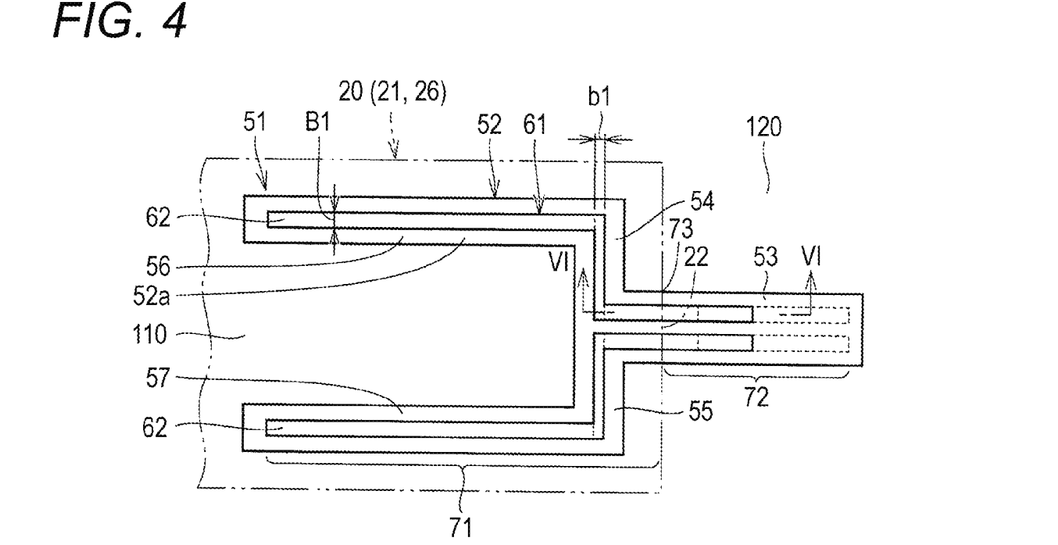
FIG. 4 is a plan view illustrating a wiring member in FIG. 1.
Figure 5:
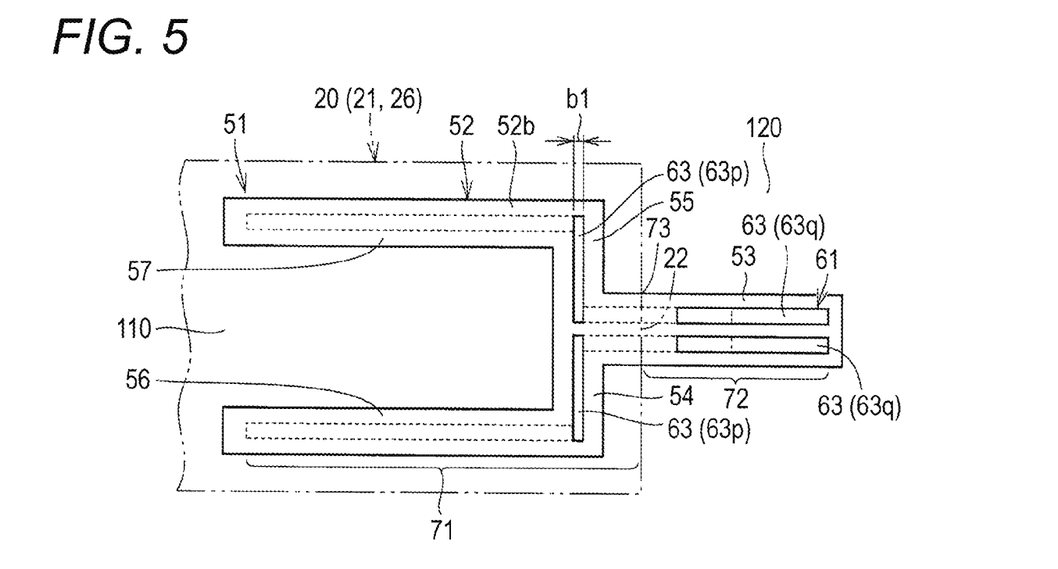
FIG. 5 is a bottom view illustrating the wiring member in FIG. 1.

FIG. 4 is a plan view illustrating the wiring member in FIG. 1. FIG. 5 is a bottom view illustrating the wiring member in FIG. 1. FIG. 4 illustrates the wiring member 51 as viewed from a side facing the planar light emitting unit 31. FIG. 5 illustrates the wiring member 51 viewed from the opposite side to the side facing the planar light emitting unit 31. In FIGS. 4 and 5, illustration of cover portions 82 and 83 described below is omitted.

With reference to FIGS. 1 to 5, the wiring member 51 is a flexible wiring board, and includes a base material 52 and a conductive unit 61.

The base material 52 has flexibility. The base material 52 is, for example, a flexible base substrate such as polyimide.

The base material 52 has an extending portion 53, branching portions 54 and 55, and facing portions 56 and 57 as constituent portions thereof. The extending portion 53 extends between the sealing region 110 and the external region 120. The extending portion 53 extends linearly. The branching portions 54 and 55 and the facing portions 56 and 57 are disposed in the sealing region 110. The branching portions 54 and 55 branch in two directions from an end of the extending portion 53 and extend along one side of the planar light emitting unit 31.

The facing portions 56 and 57 are bent from the branching portions 54 and 55, respectively, and extend along two opposite sides of the planar light emitting unit 31. The facing portions 56 and 57 extend in parallel to each other. The facing portion 56 is disposed at a position overlapping with the power feeding portion (for anode) 38 of the planar light emitting unit 31 in a thickness direction of the planar light emitting unit 31. The facing portion 57 is disposed at a position overlapping with the power feeding portion (for cathode) 39 of the planar light emitting unit 31 in the thickness direction of the planar light emitting unit 31.

Note that the shape of the base material 52 is an example. The shape of the base material 52 is appropriately changed considering the disposition of the planar light emitting unit 31, the positions of the power feeding portion (for anode) 38 and the power feeding portion (for cathode) 39, the position at which the wiring member 51 is drawn to the external region 120, and the like.

The conductive unit 61 is formed on a surface of the base material 52 by a film forming technique such as printing, vapor deposition, plating, or sputtering. The conductive unit 61 has a thickness of 0.1 μm to 10 μm, for example. A material of the conductive unit 61 is, for example, copper, nickel, or a laminate thereof. In addition to copper, nickel, and a laminate thereof, gold may be plated on a surface thereof. The conductive unit 61 is obtained not only by film formation, but may be obtained by attaching a thin metal foil such as a so-called copper foil tape to a surface of the base material 52 using a conductive adhesive (an anisotropic conductive film (ACF) or the like).

In particular, in the present embodiment, the wiring member 51 is a double-sided flexible wiring board in which the conductive units 61 are disposed on both surfaces of the base material 52.

More specifically, the base material 52 has a first surface 52a and a second surface 52b. The first surface 52a is disposed on a side facing the planar light emitting unit 31. The second surface 52b is disposed on the opposite side to the side facing the planar light emitting unit 31 and on the back side of the first surface 52a. As the conductive unit 61, a first conductive unit 62 disposed on the first surface 52a of the base material 52 and a second conductive unit 63 (63p and 63q) disposed on the second surface 52b of the base material 52 are disposed.

As illustrated in FIG. 4, the first conductive unit 62 is disposed over the sealing region 110 and the external region 120. On the first surface 52a of the base material 52, the first conductive unit 62 is disposed along the facing portion 56 from the extending portion 53 through the branching portion 54, and is disposed along the facing portion 57 from the extending portion 53 through the branching portion 55. The two first conductive units 62 are connected to the power feeding portion (for anode) 38 and the power feeding portion (for cathode) 39 of the planar light emitting unit 31 in the facing portions 56 and 57, respectively. The first conductive unit 62 may be attached using ACF or may be connected by pressure welding to the power feeding portion (for anode) 38 and the power feeding portion (for cathode) 39.

As illustrated in FIG. 5, the second conductive unit 63p is disposed in the sealing region 110. The second conductive unit 63p is disposed along the branching portions 54 and 55 in the sealing region 110. The second conductive unit 63p is disposed so as to overlap with the first conductive unit 62 disposed on the first surface 52a of the base material 52 in the branching portions 54 and 55. The second conductive unit 63p and the first conductive unit 62 are electrically connected to each other via a through hole (not illustrated) penetrating the base material 52.

The second conductive unit 63q is disposed in the external region 120. The second conductive unit 63q is disposed along the extending portion 53 in the external region 120. The second conductive unit 63q is disposed so as to partially overlap with the first conductive unit 62 disposed on the first surface 52a of the base material 52 in the extending portion 53. The second conductive unit 63q and the first conductive unit 62 are electrically connected to each other via a through hole (not illustrated) penetrating the base material 52. External wiring to which external power is supplied is connected to the second conductive unit 63q.

By using a double-sided flexible wiring board as the wiring member 51, complicated wiring can be formed. For example, by disposing the conductive units 61 on both surfaces of the base material 52 in the sealing region 110 and the external region 120 as in the present embodiment, it is possible to perform connection between the conductive unit 61 and the planar light emitting unit 31 in the sealing region 110 and connection between the conductive unit 61 and the external wiring in the external region 120 on the surfaces of the base material 52 opposite to each other. In addition, it is possible to increase the degree of freedom of wiring. For example, the degree of freedom of a surface of the base material 52 on which a continuity check land is disposed, signal lines of various sensors such as a temperature sensor, a pressure sensor, a humidity sensor, and an oxygen sensor are added, or the conductive units 61 of a positive electrode and a negative electrode intersect with each other.

In addition, in the present embodiment, by disposing the conductive units 61 on both surfaces of the base material 52 in the sealing region 110, a wiring pattern of the conductive unit 61 can be made thin (in FIGS. 4 and 5, a width b 1 of the conductive unit 61 in the branching portions 54 and 55<a width B1 of the conductive unit 61 in the facing portions 56 and 57 and the extending portion 53). With such a configuration, it is possible to reduce the width of a non-light emitting unit existing around a light emitting range of the planar light emitting unit 31.

Figure 6:
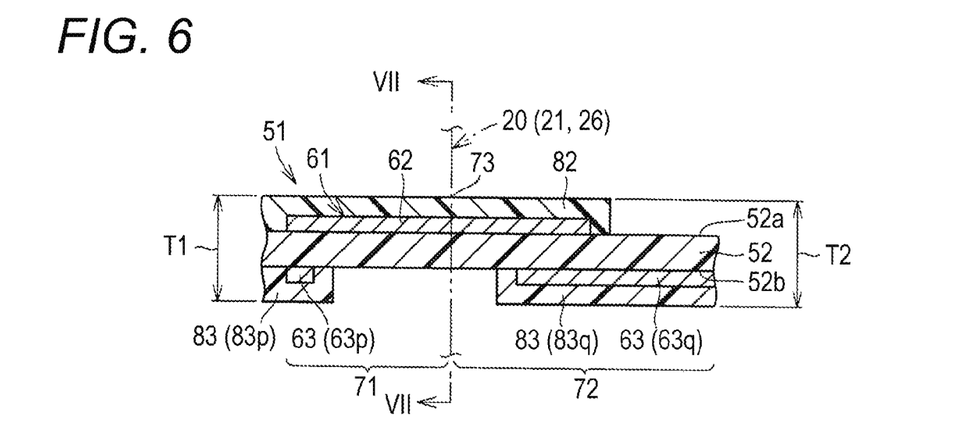
FIG. 6 is a cross-sectional view illustrating the wiring member along the line VI-VI in FIG. 4.
Figure 7:
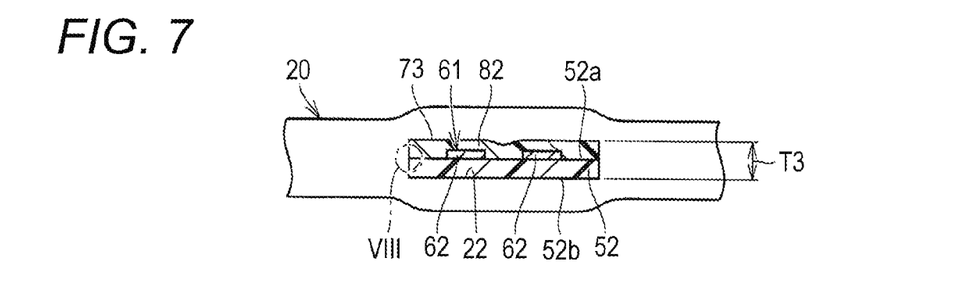
FIG. 7 is a cross-sectional view illustrating the wiring member and a sealing member along the line VII-VII in FIG. 6.

FIG. 6 is a cross-sectional view illustrating a wiring member along the line VI-VI in FIG. 4. FIG. 7 is a cross-sectional view illustrating the wiring member and a sealing member along the line VII-VII in FIG. 6.

With reference to FIGS. 4 to 7, the wiring member 51 further includes a cover portion (cover lay) 82 and a cover portion 83. The cover portions 82 and 83 are disposed on a surface of the base material 52 so as to cover the conductive unit 61.

More specifically, the cover portion 82 is disposed on the first surface 52a of the base material 52 so as to cover the first conductive unit 62. In the cover portion 82, an opening or a cutout portion (not illustrated) for exposing the first conductive unit 62 is formed at a position facing the power feeding portion (for anode) 38 and the power feeding portion (for cathode) 39 of the planar light emitting unit 31.

The cover portion 83 (83p and 83q) is disposed on the second surface 52b of the base material 52 so as to cover the second conductive unit 63. The cover portion 83p is disposed in the sealing region 110. The cover portion 83p is disposed so as to cover the second conductive unit 63p in the sealing region 110. The cover portion 83q is disposed in the external region 120. The cover portion 83q is disposed so as to cover the second conductive unit 63q in the external region 120.

The sealing member 20 has a drawing port 22. The drawing port 22 is opened at a periphery of the sealing member 20. The wiring member 51 is drawn from the sealing region 110 to the external region 120 through the drawing port 22. The drawing port 22 has an opening shape corresponding to the cross-sectional shape of the wiring member 51. The drawing port 22 is opened in a direction away from the planar light emitting unit 31 in a plane direction of the planar light emitting unit 31.

The wiring member 51 has an internal wiring portion 71, an external wiring portion 72, and a boundary wiring portion 73 as constituent portions thereof.

The internal wiring portion 71 is a portion of the wiring member 51 in which the conductive unit 61 is disposed in the sealing region 110. The external wiring portion 72 is a portion of the wiring member 51 in which the conductive unit 61 is disposed in the external region 120. The boundary wiring portion 73 is a portion of the wiring member 51 in which the conductive unit 61 is disposed in the drawing port 22. The boundary wiring portion 73 is a portion of the wiring member 51, disposed at a boundary between the internal wiring portion 71 and the external wiring portion 72.

The boundary wiring portion 73 has a smaller thickness than the internal wiring portion 71 and/or the external wiring portion 72 in a thickness direction of the planar light emitting unit 31. The thickness of each wiring portion is the thickness of a portion where the conductive unit 61 is present. In the external region 120, in a case where various electronic components are connected to the wiring member 51, the thickness of the external wiring portion 72 is the thickness of the external wiring portion 72 not including the electronic components.

More specifically, in the wiring member 51 which is a double-sided flexible wiring board, in the boundary wiring portion 73, the conductive unit 61 (first conductive unit 62) is disposed only on the first surface 52a out of the first surface 52a and the second surface 52b of the base material 52. In addition, the cover portion 83 covering the conductive unit 61 (second conductive unit 63) on the second surface 52b of the base material 52 is not disposed in the boundary wiring portion 73. With such a configuration, the boundary wiring portion 73 has a smaller thickness than the internal wiring portion 71 and has a smaller thickness than the external wiring portion 72 (T3<T1 and T2 in FIGS. 6 and 7).

In a case where the thickness of the wiring member 51 is large, a gap is generated between the sealing member 20 and the wiring member 51 due to a step of the wiring member 51, and this gap may be a leak path of oxygen or moisture. In addition, the density of an adhesive layer between the sealing sheets 21 and 26 is lowered, or oxygen and moisture easily pass due to generation of air bubbles.

Meanwhile, in the present embodiment, by making the thickness of the boundary wiring portion 73 smaller than the thickness of each of the internal wiring portion 71 and the external wiring portion 72, it is possible to suppress generation of a gap between the sealing member 20 and the wiring member 51 in the drawing port 22. This makes it possible to enhance sealing performance of the planar light emitting unit 31 by the sealing member 20.

Figure 8:
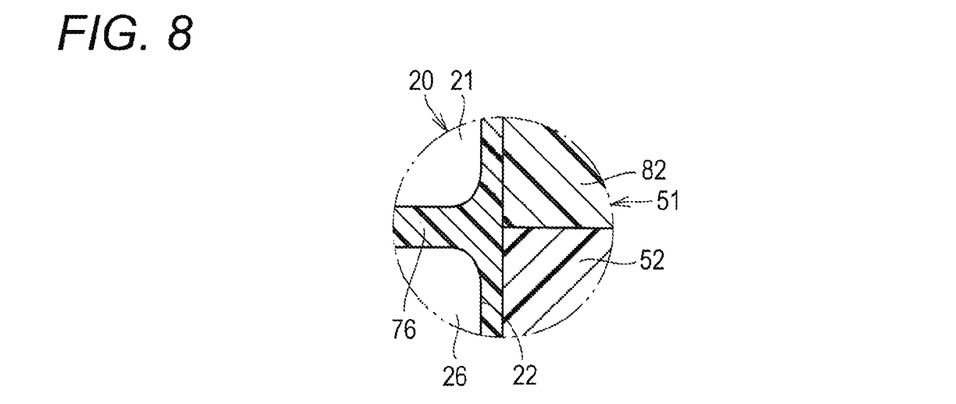
FIG. 8 is an enlarged cross-sectional view illustrating a region surrounded by the two-dot chain line VIII in FIG. 7.

FIG. 8 is an enlarged cross-sectional view of a region surrounded by the two-dot chain line VIII in FIG. 7. With reference to FIG. 8, in the present embodiment, an adhesive layer 76 for bonding the sealing sheets 21 and 26 to each other is disposed so as to fill a gap between the sealing member 20 and the wiring member 51 in the drawing port 22.

With such a configuration, it is possible to more effectively suppress generation of a gap between the sealing member 20 and the wiring member 51 in the drawing port 22. This makes it possible to suppress generation of air bubbles and reduction in the density of the adhesive layer 76 and also to prevent slight permeation of moisture and oxygen.

Note that the thickness of the adhesive for forming the adhesive layer 76 is preferably set so as to be larger than the thickness of the wiring member 51 during a step of bonding the sealing sheets 21 and 26 to each other. In this case, the adhesive is easily disposed so as to fill the gap between the sealing member 20 and the wiring member 51.

The structure of the light emitting apparatus 10 according to the first embodiment of the present invention described above will be collectively described. The light emitting apparatus 10 according to the present embodiment includes: the planar light emitting unit 31 having the light emitting surface 31s and the back surface 31t disposed on a back side of the light emitting surface 31s; the sealing member 20 disposed so as to cover the planar light emitting unit 31 from both sides of the light emitting surface 31s and the back surface 31t and forming the sealing region 110 sealing the planar light emitting unit 31; and the wiring member 51 including the conductive unit 61 electrically connected to the planar light emitting unit 31 and extending from the sealing region 110 to an outside. The sealing member 20 has the drawing port 22 opened at a periphery of the sealing member 20 when the light emitting surface 31s and the back surface 31t are viewed in plan view for drawing the wiring member 51 to the outside. The wiring member 51 includes the internal wiring portion 71 in which the conductive unit 61 is disposed in the sealing region 110; the external wiring portion 72 in which the conductive unit 61 is disposed in the outside; and the boundary wiring portion 73 in which the conductive unit 61 is disposed in the drawing port 22 and which has a smaller thickness than the internal wiring portion 71 and/or the external wiring portion 72 in a thickness direction of the planar light emitting unit 31.

The light emitting apparatus 10 according to the first embodiment of the present invention configured as described above can suppress deterioration of sealing performance of the planar light emitting unit 31 due to disposition of the wiring member 51. This makes it possible to protect the planar light emitting unit 31 from oxygen, moisture, or the like to prolong the life of the light emitting apparatus 10.

Incidentally, in the present embodiment, the case where the wiring member 51 is a flexible wiring board has been described, but the present invention is not limited to such a configuration. For example, as the wiring member, a multilayer substrate in which a plurality of layers of the conductive unit is laminated via an insulating material may be used. In this case, it is only required to set the number of layers of the conductive unit in the boundary wiring portion 73 so as to be smaller than the number of layers of the conductive unit in the internal wiring portion 71 and/or the external wiring portion 72.

Second Embodiment

Figure 9:
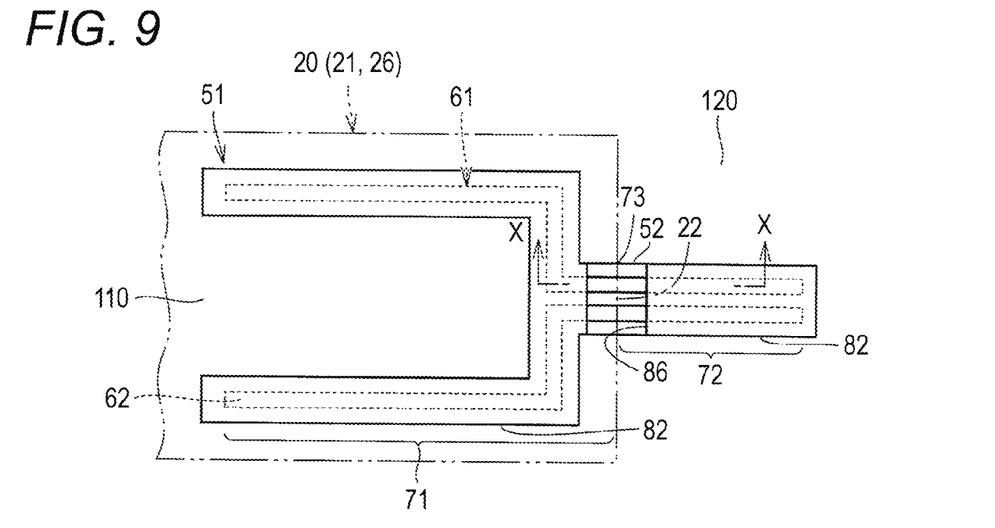
FIG. 9 is a plan view illustrating a wiring member included in a light emitting apparatus according to a second embodiment of the present invention.
Figure 10:
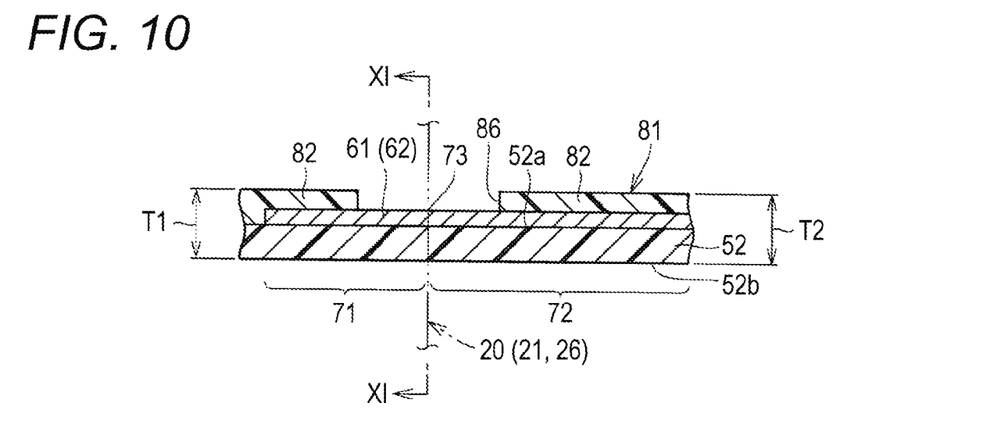
FIG. 10 is a cross-sectional view illustrating the wiring member along the line X-X in FIG. 9.
Figure 11:
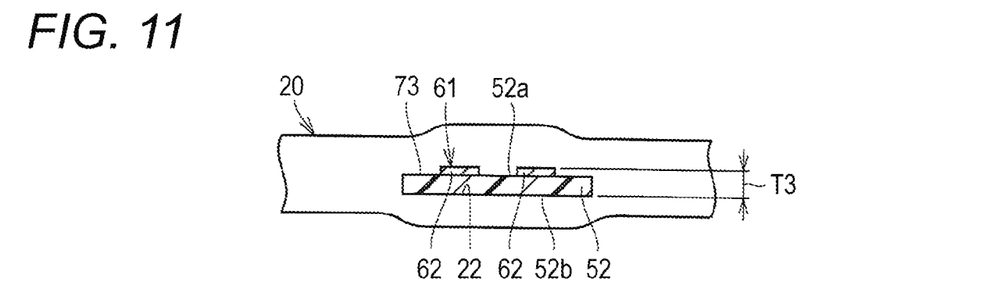
FIG. 11 is a cross-sectional view illustrating the wiring member and a sealing member along the line XI-XI in FIG. 10.

FIG. 9 is a plan view illustrating a wiring member included in a light emitting apparatus according to a second embodiment of the present invention. FIG. 10 is a cross-sectional view illustrating the wiring member along the line X-X in FIG. 9. FIG. 11 is a cross-sectional view illustrating the wiring member and a sealing member along the line XI-XI in FIG. 10. FIGS. 9, 10, and 11 are views corresponding to FIGS. 4, 6, and 7 in the first embodiment, respectively.

The light emitting apparatus according to the present embodiment basically has a similar structure to the light emitting apparatus 10 according to the first embodiment. Hereinafter, description of an overlapping structure will not be repeated.

With reference to FIGS. 9 to 11, in the present embodiment, a wiring member 51 is a single-sided flexible wiring board in which a conductive unit 61 is disposed only on one surface of a base material 52, and as the conductive unit 61, a first conductive unit 62 is disposed on a first surface 52a of the base material 52. The wiring member 51 has a cover portion 82. The cover portion 82 is disposed on the first surface 52a of the base material 52 so as to cover the first conductive unit 62.

In the cover portion 82, a cutout portion 86 is formed in a boundary wiring portion 73. The cutout portion 86 is formed so as to divide the cover portion 82 between a sealing region 110 and an external region 120. The conductive unit 61 (first conductive unit 62) is exposed from the cover portion 82 in the boundary wiring portion 73. The conductive unit 61 (first conductive unit 62) is directly covered with a sealing member 20 in the boundary wiring portion 73.

With such a configuration, a configuration is achieved in which the boundary wiring portion 73 has a smaller thickness than an internal wiring portion 71 and has a smaller thickness than an external wiring portion 72 (T3<T1 and T2 in FIGS. 10 and 11).

The light emitting apparatus according to the second embodiment of the present invention configured as described above can exhibit the effect described in the first embodiment similarly.

Third Embodiment

Figure 12:
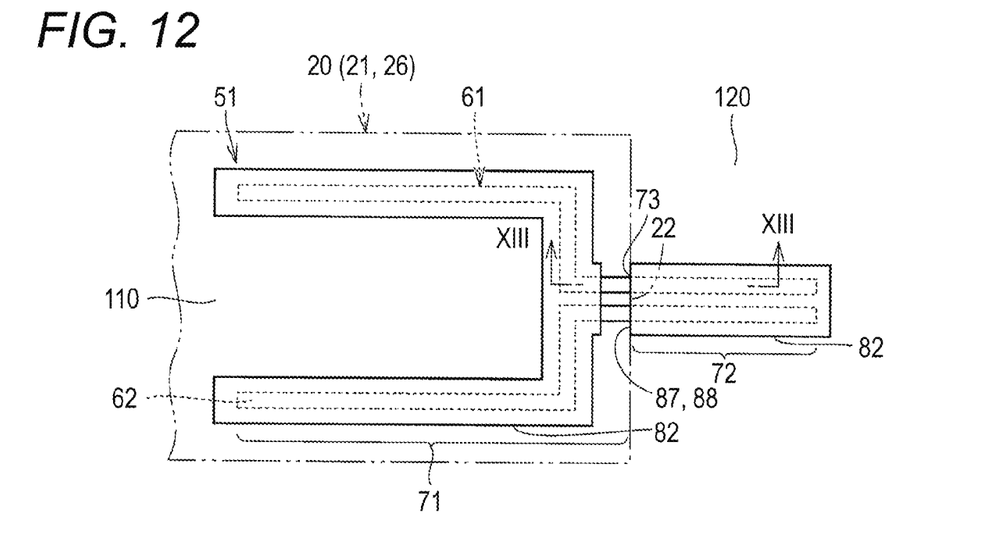
FIG. 12 is a plan view illustrating a wiring member included in a light emitting apparatus according to a third embodiment of the present invention.
Figure 13:
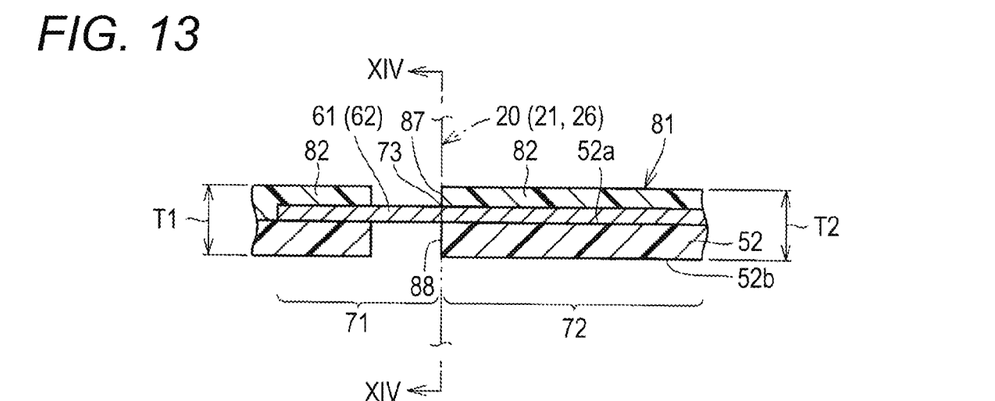
FIG. 13 is a cross-sectional view illustrating the wiring member along the line XIII-XIII in FIG. 12.
Figure 14:
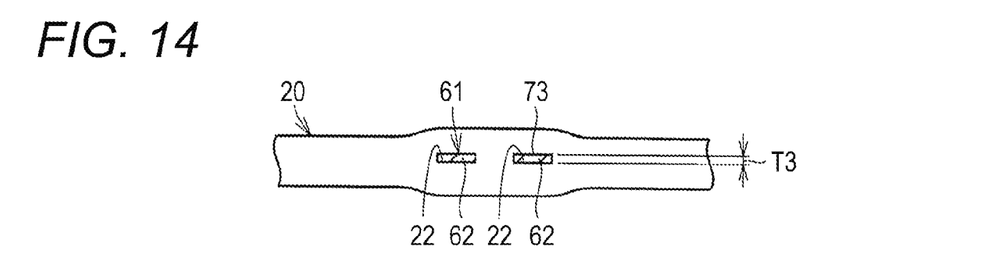
FIG. 14 is a cross-sectional view illustrating the wiring member and a sealing member along the line XIV-XIV in FIG. 13.

FIG. 12 is a plan view illustrating a wiring member included in a light emitting apparatus according to a third embodiment of the present invention. FIG. 13 is a cross-sectional view illustrating the wiring member along the line XIII-XIII in FIG. 12. FIG. 14 is a cross-sectional view illustrating the wiring member and a sealing member along the line XIV-XIV in FIG. 13. FIGS. 12, 13, and 14 are views corresponding to FIGS. 4, 6, and 7 in the first embodiment, respectively.

The light emitting apparatus according to the present embodiment basically has a similar structure to the light emitting apparatus 10 according to the first embodiment. Hereinafter, description of an overlapping structure will not be repeated.

With reference to FIGS. 12 to 14, in the present embodiment, a wiring member 51 is a single-sided flexible wiring board in which a conductive unit 61 is disposed only on one surface of a base material 52, and as the conductive unit 61, a first conductive unit 62 is disposed on a first surface 52a of the base material 52. The wiring member 51 has a cover portion 82. The cover portion 82 is disposed on the first surface 52a of the base material 52 so as to cover the first conductive unit 62.

In the cover portion 82, a cutout portion 87 is formed in a boundary wiring portion 73. The cutout portion 87 is formed so as to divide the cover portion 82 between a sealing region 110 and an external region 120. The conductive unit 61 (first conductive unit 62) is exposed from the cover portion 82 in the boundary wiring portion 73. In the base material 52, a cutout portion 88 is formed in the boundary wiring portion 73. The cutout portion 88 is formed so as to divide the base material 52 between the sealing region 110 and the external region 120. The cutout portions 87 and 88 are disposed so as to overlap with each other in a thickness direction of a planar light emitting unit 31. The conductive unit 61 (first conductive unit 62) is directly covered with a sealing member 20 in the boundary wiring portion 73.

With such a configuration, a configuration is achieved in which the boundary wiring portion 73 has a smaller thickness than an internal wiring portion 71 and has a smaller thickness than an external wiring portion 72 (T3<T1 and T2 in FIGS. 13 and 14).

The light emitting apparatus according to the third embodiment of the present invention configured as described above can exhibit the effect described in the first embodiment similarly.

Note that the cutout portion 88 may be disposed only on the base material 52 out of the cover portion 82 and the base material 52 in the light emitting apparatus according to the present embodiment.

Fourth Embodiment

Figure 15:
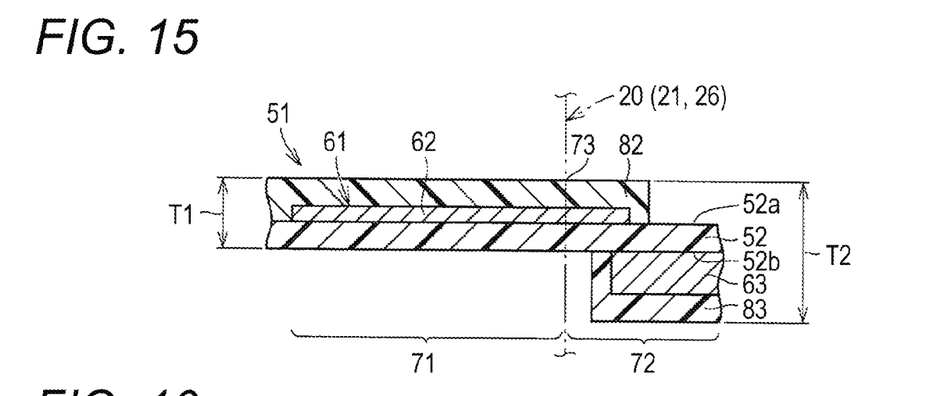
FIG. 15 is a cross-sectional view illustrating a wiring member included in a light emitting apparatus according to a fourth embodiment of the present invention.

FIG. 15 is a cross-sectional view illustrating a wiring member included in a light emitting apparatus according to a fourth embodiment of the present invention. FIG. 15 is a view corresponding to FIG. 6 in the first embodiment.

The light emitting apparatus according to the present embodiment basically has a similar structure to the light emitting apparatus 10 according to the first embodiment. Hereinafter, description of an overlapping structure will not be repeated.

With reference to FIG. 15, a wiring member 51 is a double-sided flexible wiring board in which conductive units 61 are disposed on both surfaces of a base material 52, and as the conductive unit 61, a first conductive unit 62 is disposed on a first surface 52a of the base material 52, and a second conductive unit 63 is disposed on a second surface 52b of the base material 52.

In the present embodiment, the second conductive unit 63 is disposed in an external region 120. The second conductive unit 63 is disposed along an extending portion 53 in the external region 120. The second conductive unit 63 is disposed so as to partially overlap with the first conductive unit 62 disposed on the first surface 52a of the base material 52 in the extending portion 53. The first conductive unit 62 and the second conductive unit 63 are electrically connected to each other via a through hole (not illustrated) penetrating the base material 52.

The wiring member 51 has cover portions 82 and 83. The cover portion 82 is disposed on the first surface 52a of the base material 52 so as to cover the first conductive unit 62. The cover portion 83 is disposed on the second surface 52b of the base material 52 so as to cover the second conductive unit 63.

The first conductive unit 62 has a smaller thickness than the second conductive unit 63. Only the first conductive unit 62 out of the first conductive unit 62 and the second conductive unit 63 is disposed in a boundary wiring portion 73. The cover portion 83 covering the second conductive unit 63 on the second surface 52b of the base material 52 is not disposed in the boundary wiring portion 73.

With such a configuration, a configuration is achieved in which the boundary wiring portion 73 has a smaller thickness than an external wiring portion 72 (T1<T2 in FIG. 15).

The light emitting apparatus according to the fourth embodiment of the present invention configured as described above can exhibit the effect described in the first embodiment similarly. In addition, by disposing the second conductive unit 63 having a relatively large thickness in the external region 120, it is possible to improve the strength of the external wiring portion 72 and to reduce electric resistance in the external wiring portion 72.

Fifth Embodiment

Figure 16:
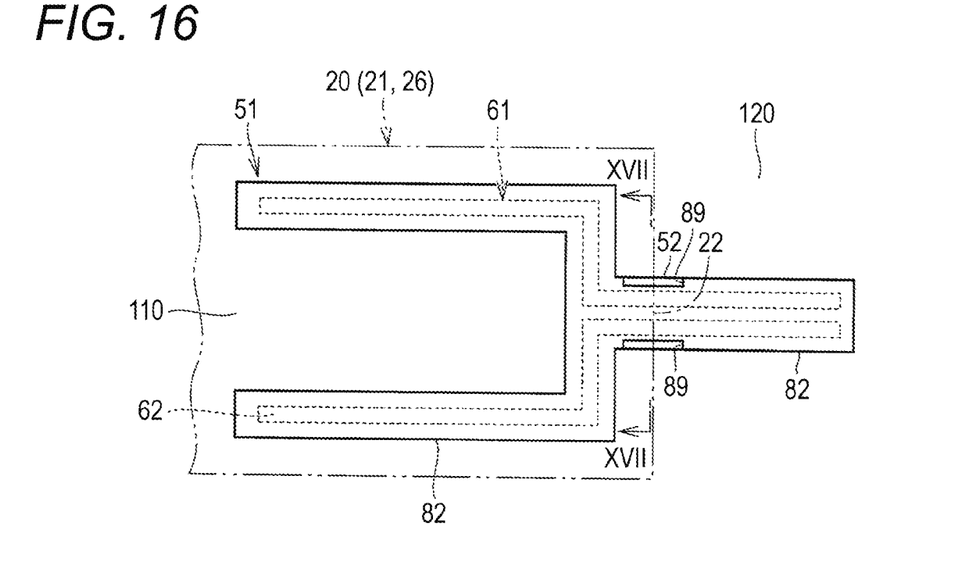
FIG. 16 is a plan view illustrating a wiring member included in a light emitting apparatus according to a fifth embodiment of the present invention.
Figure 17:
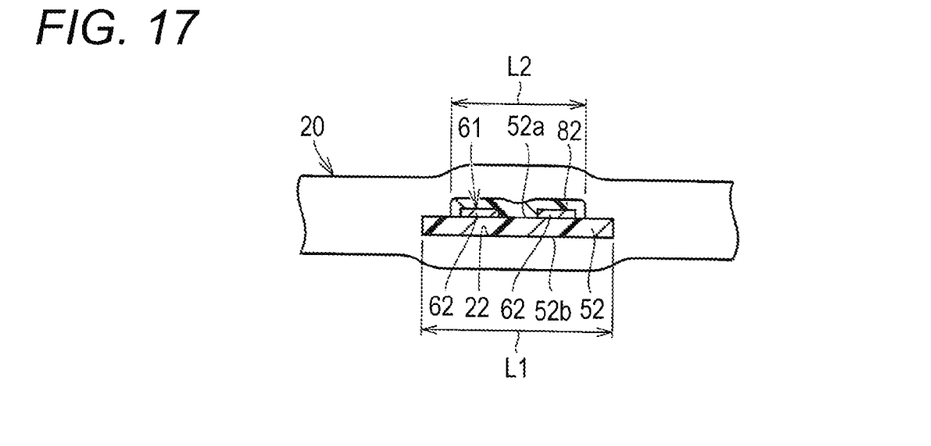
FIG. 17 is a cross-sectional view illustrating the wiring member and a sealing member along the line XVII-XVII in FIG. 16.

FIG. 16 is a plan view illustrating a wiring member included in a light emitting apparatus according to a fifth embodiment of the present invention. FIG. 17 is a cross-sectional view illustrating the wiring member and a sealing member along the line XVII-XVII in FIG. 16. FIGS. 16 and 17 are views corresponding to FIGS. 4 and 7 in the first embodiment, respectively.

The light emitting apparatus according to the present embodiment basically has a similar structure to the light emitting apparatus 10 according to the first embodiment. Hereinafter, description of an overlapping structure will not be repeated.

With reference to FIGS. 16 and 17, in the present embodiment, a wiring member 51 is a single-sided flexible wiring board in which a conductive unit 61 is disposed only on one surface of a base material 52, and as the conductive unit 61, a first conductive unit 62 is disposed on a first surface 52a of the base material 52. The wiring member 51 has a cover portion 82. The cover portion 82 is disposed on the first surface 52a of the base material 52 so as to cover the first conductive unit 62.

In the cover portion 82, a cutout portion 89 is formed in a boundary wiring portion 73. In a cross section including a drawing port 22, the cutout portion 89 is formed such that the width of the cover portion 82 in a direction orthogonal to a thickness direction of a planar light emitting unit 31 is smaller than the width of the base material 52 in the same direction (L2<L1 in FIG. 17). In the cross section including the drawing port 22, the cutout portion 89 is formed so as to expose an end of the first surface 52a of the base material 52 in the direction orthogonal to the thickness direction of the planar light emitting unit 31 from the cover portion 82. The end of the first surface 52a of the base material 52 exposed from the cover portion 82 is covered with a sealing member 20.

The light emitting apparatus according to the fifth embodiment of the present invention configured as described above can exhibit the effect described in the first embodiment similarly.

Note that a cutout portion may be formed in the base material 52 in the same form as the cutout portion 89 without forming the cutout portion 89 in the cover portion 82 in the light emitting apparatus according to the present embodiment. In this case, in the cross section including the drawing port 22, the cutout portion is formed such that the width of the base material 52 in the direction orthogonal to the thickness direction of the planar light emitting unit 31 is smaller than the width of the cover portion 82 in the same direction.

A light emitting apparatus according to one aspect of the present invention includes: a planar light emitting unit having a light emitting surface and a back surface disposed on a back side of the light emitting surface; a sealing member disposed so as to cover the planar light emitting unit from both sides of the light emitting surface and the back surface and forming a sealing region sealing the planar light emitting unit; and a wiring member including a conductive unit electrically connected to the planar light emitting unit and extending from the sealing region to an outside. The sealing member has a drawing port opened at a periphery of the sealing member when the light emitting surface and the back surface are viewed in plan view for drawing the wiring member to the outside. The wiring member includes an internal wiring portion in which the conductive unit is disposed in the sealing region; an external wiring portion in which the conductive unit is disposed in the outside; and a boundary wiring portion in which the conductive unit is disposed in the drawing port and which has a smaller thickness than the internal wiring portion and/or the external wiring portion in a thickness direction of the planar light emitting unit.

Note that the term "outside" in the present invention means a region outside the sealing region, released to a space around the sealing member.

According to such a light emitting apparatus configured as described above, by making the thickness of the boundary wiring portion smaller than the thickness of the internal wiring portion and/or the external wiring portion, it is possible to suppress generation of a gap between the wiring member and the sealing member in the drawing port. This makes it possible to suppress deterioration of sealing performance of the planar light emitting unit by the sealing member.

In addition, the wiring member is preferably a flexible wiring board including a base material and conductive units disposed on both surfaces of the base material. The conductive unit is disposed only on one surface of the base material in a boundary wiring portion.

According to such a light emitting apparatus configured as described above, by disposing the conductive unit only on one surface of the base material in the boundary wiring portion, the thickness of the boundary wiring portion can be made smaller than the thickness of the internal wiring portion and/or the external wiring portion.

In addition, the wiring member preferably further includes a cover portion disposed so as to cover the conductive unit. The cover portion is disposed only on one surface of the base material in which the conductive unit is disposed in the boundary wiring portion.

According to such a light emitting apparatus configured as described above, by disposing the cover portion only on one surface of the base material in which the conductive unit is disposed in the boundary wiring portion, the thickness of the boundary wiring portion can be made smaller than the thickness of the internal wiring portion and/or the external wiring portion.

In addition, the wiring member is preferably a flexible wiring board including a base material, a conductive unit disposed on a surface of the base material, and a cover portion disposed so as to cover the conductive unit. In the cover portion, a cutout portion is formed in the boundary wiring portion.

According to such a light emitting apparatus configured as described above, by forming a cutout portion in the cover portion in the boundary wiring portion, the thickness of the boundary wiring portion can be made smaller than the thickness of the internal wiring portion and/or the external wiring portion.

In addition, the wiring member is preferably a flexible wiring board including a base material and a conductive unit disposed on a surface of the base material. In the base material, a cutout portion is formed in the boundary wiring portion.

According to such a light emitting apparatus configured as described above, by forming the cutout portion in the base material in the boundary wiring portion, the thickness of the boundary wiring portion can be made smaller than the thickness of the internal wiring portion and/or the external wiring portion.

In addition, the wiring member is preferably a flexible wiring board including a base material and conductive units disposed on both surfaces of the base material. As the conductive unit, a first conductive unit disposed on one surface of the base material and a second conductive unit disposed on the other surface of the base material are disposed. The first conductive unit has a smaller thickness than the second conductive unit. Only the first conductive unit out of the first conductive unit and the second conductive unit is disposed in the boundary wiring portion.

According to such a light emitting apparatus configured as described above, by disposing only the first conductive unit having a relatively small thickness in the boundary wiring portion, the thickness of the boundary wiring portion can be made smaller than the thickness of the internal wiring portion and/or the external wiring portion.

In addition, the wiring member preferably includes a conductive unit formed of a plurality of layers laminated in a thickness direction of the planar light emitting unit. The number of layers of the conductive unit in the boundary wiring portion is smaller than the number of layers of the conductive unit in the internal wiring portion and/or the external wiring portion.

According to such a light emitting apparatus configured as described above, by making the total number of the conductive units in the boundary wiring portion relatively small, the thickness of the boundary wiring portion can be made smaller than the thickness of the internal wiring portion and/or the external wiring portion.

In addition, the sealing member preferably includes a first sealing sheet disposed on the light emitting surface side and a second sealing sheet disposed on the back surface side. The light emitting apparatus includes an adhesive layer for bonding peripheries of the first sealing sheet and the second sealing sheet to each other. The adhesive layer is disposed so as to fill a gap between the sealing member and the wiring member generated in the drawing port.

According to such a light emitting apparatus configured as described above, it is possible to more effectively suppress generation of a gap between the wiring member and the sealing member in the drawing port.

In addition, the planar light emitting unit preferably includes a substrate, a light emitting element disposed on the substrate, and a sealing layer disposed on the substrate and sealing the light emitting element.

According to such a light emitting apparatus configured as described above, sealing performance of the light emitting element can be enhanced by the double sealing structure of the sealing member sealing the planar light emitting unit and the sealing layer sealing the light emitting element.

A light emitting apparatus according to another aspect of the present invention includes: a planar light emitting unit having a light emitting surface and a back surface disposed on a back side of the light emitting surface; a sealing member disposed so as to cover the planar light emitting unit from both sides of the light emitting surface and the back surface and forming a sealing region sealing the planar light emitting unit; and a flexible wiring board including a base material, a conductive unit disposed on a surface of the base material and electrically connected to the planar light emitting unit, and a cover portion disposed so as to cover the conductive unit, and extending from the sealing region to an outside. The sealing member has a drawing port opened at a periphery of the sealing member when the light emitting surface and the back surface are viewed in plan view for drawing the flexible wiring board to the outside. In either one of the cover portion and the base material, in a cross section including the drawing port, a cutout portion is formed such that the width of either one of the cover portion and the base material in a direction orthogonal to a thickness direction of the planar light emitting unit is smaller than the width of the other of the cover portion and the base material in the direction orthogonal to the thickness direction of the planar light emitting unit.

Note that the term "outside" in the present invention means a region outside the sealing region, released to a space around the sealing member.

According to such a light emitting apparatus configured as described above, by forming a cutout portion in either one of the cover portion and the base material so as to have a smaller width than the other one of the cover portion and the base material in a cross section including the drawing port, it is possible to suppress generation of a gap between the flexible wiring board and the sealing member in the drawing port. This makes it possible to suppress a decrease in sealing performance of the planar light emitting unit by the sealing member.

It should be considered that the embodiments disclosed here are illustrative in all respects and not restrictive. The scope of the present invention is defined not by the above description but by the claims and intends to include all modifications within meaning and scope equivalent to the claims.

INDUSTRIAL APPLICABILITY

The present invention is applied to, for example, a light emitting apparatus using an organic EL panel.

REFERENCE SIGNS LIST

10 Light emitting apparatus
20 Sealing member
21, 26 Sealing sheet
22 Drawing port
31 Planar light emitting unit
31s Light emitting surface
31t Back surface
32 Barrier layer
33 Anode
34 Organic layer
35 Cathode
36 Sealing layer
37 Insulating layer
38, 39 Power feeding portion
41 Transparent substrate
51 Wiring member
52 Base material
52a First surface
52b Second surface
53 Extending portion
54, 55 Branching portion
56, 57 Facing portion
61 Conductive unit
62 First conductive unit
63, 63p, 63q Second conductive unit
71 Internal wiring portion
72 External wiring portion
73 Boundary wiring portion
76 Adhesive layer
82, 83, 83p, 83q Cover portion
86, 87, 88, 89 Cutout portion
110 Sealing region
120 External region.

The invention claimed is:

1. A light emitting apparatus comprising:
a planar light emitter having a light emitting surface and a back surface disposed on a back side of the light emitting surface;
a sealing member disposed so as to cover the planar light emitter from both sides of the light emitting surface and the back surface and forming a sealing region sealing the planar light emitter; and
a wiring member including a conductor electrically connected to the planar light emitter and extending from the sealing region to an outside, wherein
the sealing member has a drawing port opened at a periphery of the sealing member when the light emitting surface and the back surface are viewed in plan view for drawing the wiring member to the outside, and
the wiring member includes an internal wiring portion in which the conductor is disposed in the sealing region, an external wiring portion in which the conductor is disposed in the outside, and a boundary wiring portion in which the conductor is disposed in the drawing port and which has a smaller thickness than at least one of the internal wiring portion and the external wiring portion in a thickness direction of the planar light emitter.

2. The light emitting apparatus according to claim 1, wherein
the wiring member is a flexible wiring board including a base material and the conductors disposed on both surfaces of the base material, and
the conductor is disposed only on one surface of the base material in the boundary wiring portion.

3. The light emitting apparatus according to claim 2, wherein
the wiring member further includes a cover disposed so as to cover the conductor, and
the cover is disposed only on one surface of the base material on which the conductor is disposed in the boundary wiring portion.

4. The light emitting apparatus according to claim 1, wherein
the wiring member is a flexible wiring board including a base material, the conductor disposed on a surface of the base material, and a cover disposed so as to cover the conductor, and
a cutout portion is formed in the boundary wiring portion in the cover.

5. The light emitting apparatus according to claim 1, wherein
the wiring member is a flexible wiring board including a base material and the conductor disposed on a surface of the base material, and
a cutout portion is formed in the boundary wiring portion in the base material.

6. The light emitting apparatus according to claim 1, wherein
the wiring member is a flexible wiring board including a base material and the conductors disposed on both surfaces of the base material,
as the conductors, a first conductor disposed on one surface of the base material and a second conductor disposed on another surface of the base material are disposed,
the first conductor has a smaller thickness than the second conductor, and
only the first conductor out of the first conductor and the second conductor is disposed in the boundary wiring portion.

7. The light emitting apparatus according to claim 1, wherein
the wiring member includes the conductor formed of a plurality of layers laminated in a thickness direction of the planar light emitter, and
the number of layers of the conductor in the boundary wiring portion is smaller than the number of layers of the conductor in at least one of the internal wiring portion and the external wiring portion.

8. The light emitting apparatus according to claim 1, wherein
the sealing member includes a first sealing sheet disposed on the light emitting surface side and a second sealing sheet disposed on the back surface side,
the light emitting apparatus further comprises an adhesive layer for bonding peripheries of the first sealing sheet and the second sealing sheet to each other, and
the adhesive layer is disposed so as to fill a gap between the sealing member and the wiring member generated in the drawing port.

9. The light emitting apparatus according to claim 1, wherein the planar light emitter includes a substrate, a light emitting element disposed on the substrate, and a sealing layer disposed on the substrate and sealing the light emitting element.

10. A light emitting apparatus comprising:
a planar light emitter having a light emitting surface and a back surface disposed on a back side of the light emitting surface;
a sealing member disposed so as to cover the planar light emitter from both sides of the light emitting surface and the back surface and forming a sealing region sealing the planar light emitter; and
a flexible wiring board including a base material, a conductor disposed on a surface of the base material and electrically connected to the planar light emitter, and a cover disposed so as to cover the conductor and extending from the sealing region to an outside, wherein
the sealing member has a drawing port opened at a periphery of the sealing member when the light emitting surface and the back surface are viewed in plan view for drawing the flexible wiring board to the outside, and
in either one of the cover and the base material, in a cross section including the drawing port, a cutout portion is formed such that the width of either one of the cover and the base material in a direction orthogonal to a thickness direction of the planar light emitter is smaller than the width of the other of the cover and the base material in the direction orthogonal to the thickness direction of the planar light emitter.

11. The light emitting apparatus according to claim 2, wherein
the wiring member is a flexible wiring board including a base material, the conductor disposed on a surface of the base material, and a cover disposed so as to cover the conductor, and
a cutout portion is formed in the boundary wiring portion in the cover.

12. The light emitting apparatus according to claim 2, wherein
the wiring member is a flexible wiring board including a base material and the conductor disposed on a surface of the base material, and
a cutout portion is formed in the boundary wiring portion in the base material.

13. The light emitting apparatus according to claim 2, wherein
the wiring member is a flexible wiring board including a base material and the conductors disposed on both surfaces of the base material,
as the conductors, a first conductor disposed on one surface of the base material and a second conductor disposed on another surface of the base material are disposed,
the first conductor has a smaller thickness than the second conductor, and
only the first conductor out of the first conductor and the second conductor is disposed in the boundary wiring portion.

14. The light emitting apparatus according to claim 2, wherein the wiring member includes the conductor formed of a plurality of layers laminated in a thickness direction of the planar light emitter, and
the number of layers of the conductor in the boundary wiring portion is smaller than the number of layers of the conductor in at least one of the internal wiring portion and the external wiring portion.

15. The light emitting apparatus according to claim 2, wherein
the sealing member includes a first sealing sheet disposed on the light emitting surface side and a second sealing sheet disposed on the back surface side,
the light emitting apparatus further comprises an adhesive layer for bonding peripheries of the first sealing sheet and the second sealing sheet to each other, and
the adhesive layer is disposed so as to fill a gap between the sealing member and the wiring member generated in the drawing port.

16. The light emitting apparatus according to claim 2, wherein the planar light emitter includes a substrate, a light emitting element disposed on the substrate, and a sealing layer disposed on the substrate and sealing the light emitting element.

17. The light emitting apparatus according to claim 3, wherein
the wiring member is a flexible wiring board including a base material, the conductor disposed on a surface of the base material, and a cover disposed so as to cover the conductor, and
a cutout portion is formed in the boundary wiring portion in the cover.

18. The light emitting apparatus according to claim 3, wherein
the wiring member is a flexible wiring board including a base material and the conductor disposed on a surface of the base material, and
a cutout portion is formed in the boundary wiring portion in the base material.

19. The light emitting apparatus according to claim 3, wherein
the wiring member is a flexible wiring board including a base material and the conductors disposed on both surfaces of the base material,
as the conductors, a first conductor disposed on one surface of the base material and a second conductor disposed on another surface of the base material are disposed,
the first conductor has a smaller thickness than the second conductor, and
only the first conductor out of the first conductor and the second conductor is disposed in the boundary wiring portion.

20. The light emitting apparatus according to claim 3, wherein
the wiring member includes the conductor formed of a plurality of layers laminated in a thickness direction of the planar light emitter, and
the number of layers of the conductor in the boundary wiring portion is smaller than the number of layers of the conductor in at least one of the internal wiring portion and the external wiring portion.

* * * * *